United States Patent
Chen et al.

(10) Patent No.: US 6,208,846 B1
(45) Date of Patent: Mar. 27, 2001

(54) METHOD AND APPARATUS FOR ENHANCING TRANSMITTER CIRCUIT EFFICIENCY OF MOBILE RADIO UNITS BY SELECTABLE SWITCHING OF POWER AMPLIFIER

(75) Inventors: Young-Kai Chen, Berkeley Heights; Sanjay Kasturia, Monmouth; Jenshan Lin, Pine Brook; Huan-Shang Tsai, Parsippany, all of NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 08/782,355

(22) Filed: Jan. 13, 1997

(51) Int. Cl.⁷ ........................................ H04B 1/04
(52) U.S. Cl. .................... 455/127; 455/91; 455/69; 330/51; 330/151
(58) Field of Search ................ 455/127, 126, 455/91, 86, 116, 69; 330/51, 151

(56) References Cited

U.S. PATENT DOCUMENTS

| | | | |
|---|---|---|---|
| 4,613,990 | * 9/1986 | Halpern | 455/69 X |
| 4,811,421 | * 3/1989 | Havel et al. | 455/69 |
| 5,101,507 | 3/1992 | Jung | 455/127 |
| 5,152,004 | * 9/1992 | Vaisanen et al. | 455/68 |
| 5,175,871 | * 12/1992 | Kunkel | 455/69 |
| 5,426,641 | 6/1995 | Afrashten et al. | 370/95.3 |
| 5,530,923 | * 6/1996 | Heinonen et al. | 455/126 |
| 5,548,246 | * 8/1996 | Yamamoto et al. | 330/51 |
| 5,661,434 | * 8/1997 | Brozovich et al. | 330/51 |
| 5,872,481 | * 2/1999 | Sevic et al. | 330/51 |
| 5,909,643 | 6/1999 | Aihara | 455/127 |

OTHER PUBLICATIONS

High–Efficiency Amplifiers for Portable Handsets; T. Mader, M. Marković, Z. Popvić and R. Tayrani; Sixth IEEE Int'l Symposium on Personal, Indoor and Mobile Radio Communications, Sep. 27–29, 1995; pp. 1242–1245.

Analysis and Design of a Two–Loop Controlled Switching Power Amplifier; H. Endo, T. Yamashita and T. Sugiura; IEICE Trans. Commun., vol. E76–B, No. 9, Sep. 1993; pp. 1193–1201.

High Efficiency Transmitting Power Amplifiers for Portable Radio Units; T. Nojima, S. Nishiki and K. Chiba; IEICE Transactions, vol. E74, No. 6, Jun. 1991, pp. 1563–1570.

* cited by examiner

Primary Examiner—Fan Tsang
Assistant Examiner—Philip J. Sobutka
(74) Attorney, Agent, or Firm—Synnestvedt & Lechner LLP

(57) ABSTRACT

A circuit that increases the efficiency of a radio frequency mobile telephone unit is disclosed. When the signal strength between the base station and the mobile unit is below a predetermined signal strength level, the power amplifier is turned on and the transmitter circuit of the mobile unit fully amplifies the RF signal. However, when the signal strength between the mobile telephone unit and the base station is above a predetermined signal strength level, the power amplifier is deactivated and bypassed from the transmitter circuitry, thereby conserving the battery power of the mobile unit.

8 Claims, 2 Drawing Sheets

METHOD AND APPARATUS FOR ENHANCING TRANSMITTER CIRCUIT EFFICIENCY OF MOBILE RADIO UNITS BY SELECTABLE SWITCHING OF POWER AMPLIFIER

FIELD OF THE INVENTION

The present invention relates to a radio frequency (RF) power level control circuit and, more particularly, to a circuit for increasing the efficiency of the power amplifier in mobile telephone units.

BACKGROUND OF THE INVENTION

In all radio frequency (RF) communication systems, the power needed to transmit a signal consumes a large proportion of the available energy. An increase in the efficiency of the transmitting circuit of a communication device would decrease its power consumption. In addition, low power consumption due to higher efficiency reduces the heat generated in each communication device due to internal power dissipation.

Compact size and low weight are desirable features in cellular and other portable radio telephones (hereinafter referred to as mobile units). The power needed to operate a mobile unit is usually drawn from a battery. Since the battery is typically the largest and heaviest device in a mobile unit, increasing the efficiency of the mobile unit—and specifically of the transmitting circuit—would allow a smaller battery to be used, thereby decreasing the overall size and weight of the mobile unit.

The transmitting circuit of a typical mobile unit includes an RF source, a driver amplifier circuit, a power amplifier circuit and an antenna. (The driver amplifier and the power amplifier are sometimes referred to together as a two-stage power amplifier circuit.) The driver amplifier circuit and the power amplifier circuit include power transistors which amplify an RF signal generated by the RF source.

When the typical mobile unit is active, the driver and power amplifier are continuously on. Applicants have recognized, however, that the power needed to transmit a signal from the mobile unit to a base station does not always require the full operating power of the driver and power amplifiers. That is, it is estimated that for many applications the power amplifier is actually only required approximately twenty percent of the time (e.g., near the fringe of a cell, behind a structure, etc.) Accordingly, during the majority of the time the mobile unit is being used, the driver amplifier alone can produce a signal strong enough so that it will be detected by the base station.

Presently, several techniques have been devised that attempt to increase the efficiency of power amplifiers. These techniques include circuits that control the drain or collector supply voltage of the transistors used in a linear power amplifier; utilization of quasi-linear amplifiers; and utilization of non-linear precompensation circuits (e.g., a feedback controlled predistortion circuit). However, each of the aforementioned techniques require additional—and usually complex—circuitry and have difficulty maintaining the desired linear amplification (this is especially true because of the harsher environmental conditions to which mobile units are exposed). Furthermore, these techniques usually increase the heat generated in the mobile unit due to internal power dissipation of the additional circuitry.

SUMMARY OF THE INVENTION

The subject invention includes a method and apparatus for increasing the efficiency of the transmitter circuit of a mobile unit. Specifically, the subject invention includes a power control circuit that regulates the operation of the power amplifier stage of the transmitter circuit.

In accordance with the subject invention, the power control circuit includes a driver amplifier and a power amplifier, each having an input and an output, and two three-way switches. The input of the driver amplifier defines the input of the power control circuit. The output of the power control circuit is switchable between the output of the driver amplifier or the output of the power amplifier.

Each three-way switch has two terminals which are selectably connected to a common terminal. The common terminal of a first three-way switch is connected to the output of the driver amplifier; a first selectable terminal of the first switch is connected to the input of the power amplifier. The common terminal of the second three-way switch generally defines the output of the power control circuit and is connected to the antenna of the mobile unit. A first selectable terminal of the second switch is connected to the output of the power amplifier, and the second selectable terminal of the second switch is connected to the second selectable terminal of the first switch.

Control means is used to control the operation of said power amplifier and said first and second switches. The control means cooperates with the receiver circuitry of the mobile unit. During regular operation, the power amplifier is not used and the control means bypasses the power amplifier. This is accomplished by deactivating the power amplifier and routing the output signal from the driver amplifier through the first switch, then to the second switch and, finally, to the antenna.

If the receiver circuitry detects that the signal strength from the base station is too weak or below a predetermined value, it sends a "weak signal strength" control signal to the control means. When the control means receives the weak signal strength control signal, it activates the power amplifier, connects the driver amplifier to the power amplifier via the first switch, and connects the output of the power amplifier to the antenna via the second switch. That is, the connection between the first and second switches via the second selectable terminals is interrupted and the first selectable terminal of each switch is connected to its respective common terminal.

In some cellular telephone systems, the base station monitors the signal it receives from the mobile unit. When the base station detects that the signal it is receiving falls below a predetermined level, the base station sends a command signal back to the mobile unit directing the mobile unit to increase its transmitting power. (This can be done by changing the output power of the RF source, increasing the gate voltage of one of the power transistors or increasing the base current of one of the power transistors.) The control means of the subject power control circuit can be easily adapted to communicate with the receiver circuit of the mobile unit for using the command signal from the base station to regulate the operation of the power amplifier and the three-way switches.

DETAILED DESCRIPTION OF THE PREFERRED EMBODIMENT

Figure 1:
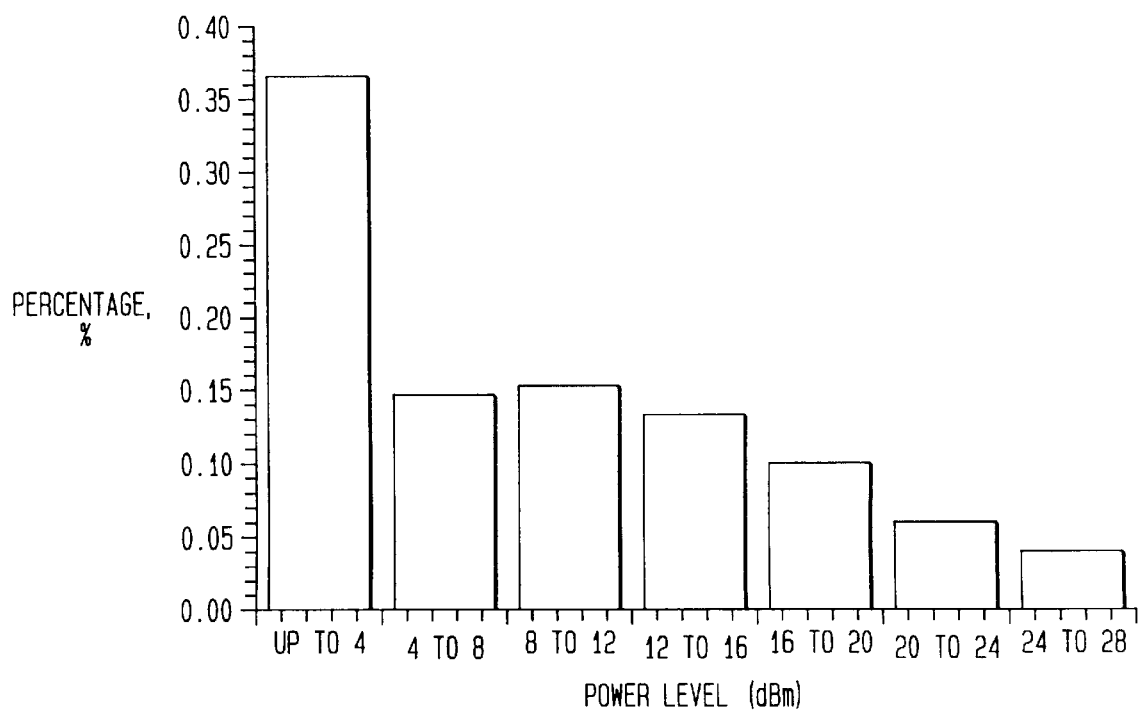
FIG. 1 is a graph of a typical power amplifier response of prior art mobile RF telephone units (i.e., for a IS-136 TDMA system).

Referring now to the FIG. 1, the percentage of time a mobile unit must transmit its signal at a particular power level, in order to maintain RF communication with a base station, is indicated. As can be seen, approximately thirty-seven percent of the time the output power of the mobile unit (or, more specifically, the RF transmitting circuit) does not need to exceed 4 dBm. If the output power of the mobile unit is 16 dBm, it is sufficient to maintain communication with a base station approximately eighty percent of the time. Since a typical driver amplifier can output a 16 dBm signal, the power amplifier of a typical RF transmitting circuit need only be on during the twenty percent of the time that the signal from the typical driver amplifier is insufficient for staying in RF contact with the base station.

Figure 2:
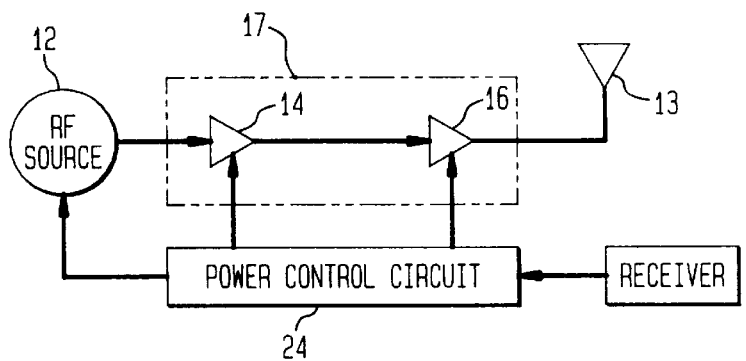
FIG. 2 is a schematic diagram of a prior art RF power amplifier circuit.

As shown in FIG. 2, a prior art transmission circuit of a typical mobile unit includes an RF source 12, driver amplifier circuit 14, a power amplifier circuit 16, an antenna 13 and a primary control circuit 24. (The driver amplifier and the power amplifier are sometimes referred to as a two-stage amplifier 17.) A common method employed by prior art power control circuits to increase the efficiency of the transmitter circuit is by adjusting the gate and/or source voltage(s) of the transistors that comprise the driver amplifier or the power amplifier. When a mobile unit is on, the driver amplifier 14 and the power amplifier 16 are on continuously. At the full output power level, the power added efficiency (PAE) of a prior art mobile unit is about 50 percent. However, since the mobile unit usually stays in relatively close proximity to a base station (where the power amplifier is not needed to stay in RF contact with the base station), the PAE is very low.

Figure 3:
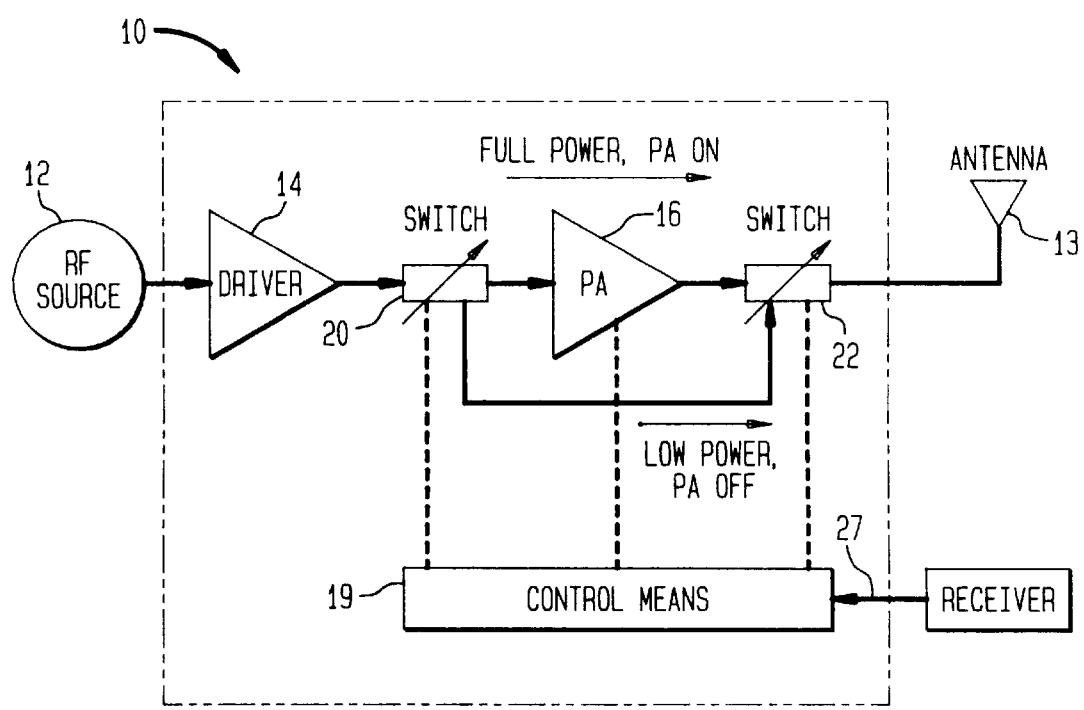
FIG. 3 is a schematic diagram of the switching RF power amplifier in accordance with the present invention.

Referring now to FIG. 3, the power control circuit in accordance with the subject invention is generally indicated at 10. The subject power control circuit 10 includes a driver amplifier 14, power amplifier 16, three-way switches 20, 22, and control means 19. The input to driver amplifier 14 generally defines the input of the power control circuit 10. The subject invention can selectably deactivate and bypass the power amplifier 16, thereby significantly increasing the PAE.

In the preferred embodiment, three-way switches 20, 22 are inserted into the transmission line before and after the power amplifier 16, as shown. Each three-way switch has two terminals which are selectably connected to a common terminal. (Although its possible to use manually operated switches, it is preferable to have an electronic means to control the switching.)

The common terminal of a first three-way switch 20 is connected to the output of the driver amplifier 14. A first selectable terminal of the first switch 20 is connected to the input of power amplifier 16. The common terminal of a second three-way switch 22 generally defines the output of the power control circuit 10 and is connected to antenna 13. A first selectable terminal of second switch 22 is connected to the output of power amplifier 16. The second selectable terminals of first switch 20 and second switch 22 are connected together.

The control means 19 has an input 27 that is responsive to an external control signal generated by the receiver. Control means 19 has an output 29 that preferably has two values or modes for controlling the activation of the power amplifier 16 and the selection of terminals of switches 20, 22. In the first mode, the power amplifier is deactivated and switches 20, 22 each connect their common terminal to their respective second selectable terminal, thereby routing the RF signal from the driver 14 directly to antenna 13. In the second mode, the power amplifier 16 is activated and switches 20, 22 each connect their common terminal to their respective first selectable terminal, thereby routing the RF signal from the driver amplifier 14 to first switch 20, through the power amplifier 16, to second switch 22 and then to antenna 13.

In a preferred embodiment, the receiver circuit of a mobile unit includes a signal strength meter which provides the user of the mobile unit with a general indication of the strength of the signal received from the base station. When the power of the signal received by the mobile unit is low (e.g., the mobile unit is near the fringe of a cell), the signal strength meter will indicate a relatively weak signal strength. The signal strength meter includes a detection circuit that measures the amplitude of the voltage of the signal received from the base station. The detection circuit can be readily modified to trigger control means 19.

During normal operation (i.e., the control means is in its first mode) of a mobile unit utilizing the present invention, the power amplifier is deactivated and the RF signal bypasses it. When the signal strength of a signal received from the base station drops below a pre-determined power level or voltage, the detection circuit sends an external control signal to the control means 19 via input 27. The control means 19 is set or triggered to the second mode which activates power amplifier 16; operates first switch 20 thereby connecting the output of the driver amplifier 14 to the input of the power amplifier 16; and also operates second switch 22 which connects the output of the power amplifier 16 to the antenna 13. Therefore, the RF signal from the RF source is amplified by the driver amplifier 14 and the power amplifier 16. The RF signal that is amplified by both amplifiers 14, 16 ensures that RF communication between the mobile unit and base station is maintained.

When the detection circuit detects that a relatively strong signal is received from the base station (i.e., above the predetermined level or voltage), the detection circuit resets the control means 19 to the first mode, thereby turning off power amplifier 16, and changing the selectable connections of switches 20, 22. In the first mode, the RF signal from the mobile unit is directed from the output of driver 14 to antenna 13 via first and second switches 20, 22 and bypasses the inactive power amplifier 16.

Another important embodiment is used in connection with prior art cellular telephone systems that have base stations which actively monitor the signal strength received from the mobile unit (e.g., IS-95 code division multiple access). In such systems, the base station continuously monitors the signal strength from initialization through the termination of the call. If the signal received from the mobile unit is below one or more pre-determined levels, the base station returns a command signal to the mobile unit directing the transmitting circuit of the mobile unit to increase the gain of its output signal. If the base station receives a signal from the mobile unit that has a signal strength above one or more pre-determined levels, the base station returns a command signal to the mobile unit directing the mobile unit to decrease the gain of its output signal. The mobile units in these active monitoring cell telephone systems have control circuitry 24 (See FIG. 2) for incrementally increasing or decreasing the gain of the transmitter circuit (e.g., by changing the output power of the RF source, or by adjusting the gate or source current of the power transistors that comprise the power amplifier circuit).

Referring again to FIG. 3, the subject invention can be adapted for use in such active monitoring cellular telephone systems by having the control means 19 trigger when the receiver detects the appropriate command signal from the base station. Furthermore, the subject invention can be used independent of, or in addition to, the aforementioned transmitter gain control circuit 24 of the active monitoring cell system. When the base station detects that the signal it receives from the mobile unit is weak (i.e., below a pre-determined signal strength level), the base station sends a command signal back to the mobile unit directing the mobile unit to increase the gain of it's output signal (i.e., increase its transmitting power). The receiver of the mobile unit interprets the increase gain command signal from the base station, and passes it to the control means 19 to activate the power amplifier 16 and route the signal from the driver amplifier 14 to the power amplifier 16 via the first switch 20 and finally to the antenna via the second switch 22. When the mobile unit receives a decrease gain command signal from the base station, the receiver interprets the signal and passes it to the control means 19. The control means is triggered by the new command signal, thereby deactivating power amplifier 16 and setting the selectable terminals of switches 20, 22 to bypass the power amplifier 16.

Typically, prior art active monitoring cellular telephone systems have several graduated levels at which the output power of the mobile unit may be incrementally increased. The subject invention may be adapted so that control means 19 is triggered at any one of the graduated levels.

The control means 19 is substantially the same in both of the aforementioned embodiments. The receiver, which generates the external control signal that triggers the control means 19, interprets slightly different pre-determined signals in the two principle embodiments. In each embodiment, the mobile unit's receiver generally has the appropriate circuitry for determining whether its transmitting power needs to be increased or decreased. Therefore, only minor adjustments need to be made to the receiver to adapt it for use in the subject invention.

While the subject invention has been described in connection with a preferred embodiment, it would be apparent to those skilled in the art that modifications and changes thereto can be made without departing from the true spirit and scope of the invention. Therefore, it is intended by the appended claims to cover all such changes and modifications which come within the true spirit and scope of the invention.

What is claimed is:

1. A power control circuit for a mobile telephone having a radio-frequency source, an antenna, and a receiver circuit, the power control circuit comprising:
   a) a driver amplifier connected to the source;
   b) a power amplifier;
   c) a first three-way switch connected between said driver amplifier and said power amplifier;
   d) a second three-way switch connected between said power amplifier, said first switch, and the antenna; and
   e) control means connected to the receiver circuit for controlling the operation of said first and second switches and said power amplifier, said control means having at least two modes, a first mode wherein said control means deactivates said power amplifier and bypasses said power amplifier by connecting the driver amplifier to the antenna via said first and second switches and a second mode wherein said control means activates said power amplifier, connects the driver amplifier to the power amplifier via said first switch and connects the output of the power amplifier to the antenna via said second switch said control means being set by a control signal from the receiver circuit.

2. The power control circuit of claim 1 further comprising a signal strength detector that generates the control signal when the signal strength of a received signal is below a predetermined level.

3. The power control circuit of claim 1 further comprising means for interpreting a command signal generated by a base station that initiates the control signal.

4. In a cellular telephone for use in a cellular telephone system including at least one base station, the cellular telephone having a transmitting circuit connected to an antenna for generating an RF signal to keep in RF communication with the base station, a power control circuit for use in the transmitting circuit, comprising:
   a) a driver amplifier;
   b) a power amplifier;
   c) a first three-way switch connected between said driver amplifier and said power amplifier;
   d) a second three-way switch connected to said power amplifier, said first switch, and the antenna; and
   e) control means responsive to a command signal initiated by the base station for regulating the power of the RF signal by controlling the operation of said first and second switches and said power amplifier.

5. The power control circuit of claim 4 wherein said control means has at least two modes, comprising:
   a first mode wherein said control means deactivates said power amplifier, and bypasses said power amplifier by connecting the driver amplifier to the antenna via said first and second switches; and
   a second mode wherein said control means activates said power amplifier, connects the driver amplifier to the power amplifier via said first switch, and connects the power amplifier to the antenna via said second switch.

6. A method of increasing the power efficiency of a mobile telephone, the mobile telephone having a radio-frequency source, an antenna, and a receiver circuit, the method comprising the steps of:
   a) amplifying an RF signal generated by the source;
   b) providing a second stage amplifier that selectively amplifies said amplified RF signal;
   c) detecting an externally generated control signal;
   d) deactivating said second stage amplifier and bypassing said second stage amplifier when said control signal has a first value; and
   e) activating said second stage amplifier and further amplifying said amplified RF signal by passing said amplified RF signal through the second stage amplifier when said control signal has a second value.

7. The method of claim 6 further comprising the step of:
   f) controlling the value of the control signal in response to the signal strength of a signal received from a base station.

8. The method of claim 10 further comprising the step of:
   f) controlling the value of the control signal in response to a command signal generated by a base station.

* * * * *